United States Patent [19]
McFadden

[11] Patent Number: 6,073,896
[45] Date of Patent: Jun. 13, 2000

[54] GASKET ARRANGEMENT HAVING RETENTION CLIP TRACK AND METHOD OF MAKING A GASKET ARRANGEMENT AND METHOD FOR SECURING A GASKET TO A WALL

[75] Inventor: Jeffrey McFadden, Blairstown, N.J.

[73] Assignee: Instruments Specialties Co., Inc., Delaware Water Gap, Pa.

[21] Appl. No.: 09/150,066

[22] Filed: Sep. 9, 1998

[51] Int. Cl.[7] ........................................ E04G 5/06
[52] U.S. Cl. ............................ 248/231.81; 248/74.2; 248/300
[58] Field of Search .................... 248/231.81, 228.7, 248/229.26, 229.16, 300, 214, 219.1, 49, 74.2; 174/35 GC

[56] References Cited

U.S. PATENT DOCUMENTS 5,695,162  12/1997  DiCastro ........................ 248/231.81
5,782,090   7/1998  Locke ............................. 248/74.2 X

*Primary Examiner*—Ramon O. Ramirez
*Attorney, Agent, or Firm*—Burns, Doane, Swecker & Mathis, L.L.P.

[57] ABSTRACT

A gasket arrangement includes a gasket and a retention clip track. The retention clip track includes a substantially flat track having a first surface, a second surface, a first edge extending between the first surface and the second surface, and a second edge extending between the first surface and the second surface on an opposite side of the track from the first edge. At least one clip extending from the first edge, the clip and the track together forming a substantially C-shaped structure. The track has a plurality of adjacent saw tooth-shaped recesses extending from at least one of the second edge toward the first edge and the first edge toward the second edge. The gasket is attached to the track. A retention clip track, a method for making a gasket arrangement, and a method for installing a gasket arrangement are also disclosed.

27 Claims, 3 Drawing Sheets

000# GASKET ARRANGEMENT HAVING RETENTION CLIP TRACK AND METHOD OF MAKING A GASKET ARRANGEMENT AND METHOD FOR SECURING A GASKET TO A WALL

FIELD OF THE INVENTION

The present invention relates to a retention clip track and, more particularly, to a retention clip track forming part of a gasket arrangement for mounting relative to a wall and to a method for mounting a gasket arrangement relative to a wall.

BACKGROUND AND SUMMARY OF THE INVENTION

As is well known, selected electric or electronic parts radiate electromagnetic waves which can cause noise or unwanted signals to appear in electric or electronic parts and devices existing in the vicinity of the radiating parts. Accordingly, it is highly desirable to provide shielding and/or grounding for electronic components that use circuitry that emits or is susceptible to electromagnetic radiation. It is known that these components can be shielded to reduce undesirable electromagnetic interference and/or susceptibility effects with the use of a conductive shield that reflects or dissipates the electromagnetic charges and fields. Such shielding may be grounded to allow the offending electrical charges and fields to be dissipated without disrupting the operation of the electronic components enclosed within the shield.

Various types of EMI/RFI shielding devices are known for reducing the transmission of EMI and RFI. Among the known devices are gaskets or strips of a resiliently deformable material which are secured to an openable access panel, door, drawer, or the like (hereinafter "door"), to block the transmission of EMI/RFI through the small clearance between the door and the adjacent structure which forms the opening into and out of which the door is movable. Such strips are useful for shielding openings of housings for electronic components which are highly sensitive to the adverse effects of EMI/RFI.

Such known devices are typically made of one of several materials which have the combined functions of acting as an EMI/RFI shield, and which are resiliently deformable so that they can be compressed between the door when closed, and will spring back to an uncompressed configuration when the door is moved out of the opening. U.S. patent application Ser. No. 08/819,983, filed Mar. 18, 1997, entitled "SELF-TERMINATING, KNITTED METALIZED YARN EMI/RFI SHIELDING GASKET," which is hereby incorporated by reference, provides examples of such gaskets.

Prior shielding strips, although providing an adequate level of shielding for the electronic devices, are often difficult to install on an electronics housing and are often not secured to a mounting surface to withstand the forces generated in use without detaching from the surface. For example, one prior strip utilizes a track which is riveted to the mounting surface of the housing, the shielding strip then being slid onto the riveted track to hold the strip in place. Although providing a secure mount for the shielding strip, the riveted track involves a relatively complicated installation procedure, involving several steps, and is therefore labor intensive. Furthermore, a shielding strip which requires a riveted track is relatively expensive, because it requires extra parts (a track and rivets), and added labor to install. The riveted track is also somewhat prone to misinstallation, because installation requires alignment of a rivet with holes in the track. U.S. patent application Ser. No. 09/139,654, entitled "MOUNTING SYSTEM AND METHOD FOR MOUNTING TRACK HAVING BARBED RIVETS," by Anthony Michael Sosnowski, filed Aug. 25, 1998, which is hereby incorporated by reference, discloses a mounting system including a track having compressible barbs that extend through holes in a housing wall to secure the mounting track to the wall.

One difficulty with most prior art gasket mounting arrangements is that, in mounting the gasket around a structure such as a door, it is difficult, if not impossible to bend the mounting arrangement, which typically includes a thin steel or plastic track, i.e., a substantially planar track, around bends because doing so would involve bending the track in its plane. While the track might be easily bendable out of the original plane, it will typically fold up at corners when bent in its plane, risking a poor seal at the corners. Solutions to this problem have included using multiple gasket/track arrangements around bends, and forming mounting arrangements having the specific shape of the wall to which they are to be mounted. The multiple mounting arrangement solution is not highly desirable because substantial installation work is necessary, it is typically unsightly, and gaps may exist between adjacent mounting arrangements, thus defeating the shielding function. It has not typically been desirable to form mounting arrangements for specific mounting applications, i.e., for specific, unique or limited quantity shapes, because of the comparatively high cost involved in forming a track for the special application, which usually includes cutting a track shape from a plate of material or joining together track sections, as compared with typical track arrangements that can be mass produced at relatively low cost.

It is desirable to provide a mounting arrangement and method for mounting gasket arrangements that is inexpensive and simple to install. It is also desirable to provide a mounting arrangement that can be attached to a wall around bends with minimal difficulty, and without the need for using multiple track sections. It is also desirable to provide a mounting arrangement that can be produced in a simple manner for mounting on complex shapes.

According to an embodiment of the present invention, a retention clip track includes a substantially flat track having a first surface, a second surface, a first edge extending between the first surface and the second surface, and a second edge extending between the first surface and the second surface on an opposite side of the track from the first edge. At least one clip extends from the first edge, the clip and the track together forming a substantially C-shaped structure. The track has a plurality of adjacent saw tooth-shaped recesses extending from at least one of the second edge toward the first edge and the first edge toward the second edge.

According to another embodiment of the present invention, a gasket arrangement includes a gasket and a retention clip track. The retention clip track includes a substantially flat track having a first surface, a second surface, a first edge extending between the first surface and the second surface and a second edge extending between the first surface and the second surface on an opposite side of the track from the first edge. At least one clip extending from the first edge, the clip and the track together forming a substantially C-shaped structure. The track has a plurality of adjacent saw tooth-shaped recesses extending from at least one of the second edge toward the first edge and the first edge toward the second edge. The gasket is attached to the track.

According to yet another embodiment of the present invention, a method is disclosed for securing a gasket arrangement to a wall, the wall having a first surface, a second surface, and an edge between the first and the second surface, and the edge having at least one non-linear portion. According to the method, a longitudinal track is provided with a plurality of tabs that extend laterally from a first edge of the track. A plurality of saw tooth-shaped recesses is formed in the track such that the recesses extend from at least one of second edge of the track toward the first edge and a first edge of the track toward the second edge of the track. The plurality of tabs are bent relative to track so that the tabs and the track together form substantially C-shaped clips. A gasket is attached to a surface of the track to form a gasket arrangement. The gasket arrangement is bent at the saw teeth-shaped recesses of the track so that the gasket arrangement conforms generally to a shape of the edge of the wall. The gasket arrangement is secured to the wall by fitting the wall in the clips formed by the tabs and the track.

According to still another embodiment of the present invention, a method is disclosed for making a gasket arrangement for attachment to a wall, the wall having a first surface, a second surface, and an edge between the first and the second surface, and the edge having at least one non-linear portion. According to the method, a longitudinal track is provided with a plurality of tabs that extend laterally from a first edge of the track. A plurality of saw tooth-shaped recesses is formed in the track such that the recesses extend from at least one of second edge of the track toward the first edge and a first edge of the track toward the second edge of the track. The plurality of tabs are bent relative to track so that the tabs and the track together form substantially C-shaped clips. A gasket is attached to a surface of the track to form a gasket arrangement.

It will be appreciated that, although a preferred embodiment of the present invention is as a mounting system and method for mounting shielding strips, the present invention has numerous applications in other fields where it is desirable to mount items relative to one another.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION

Figure 1:
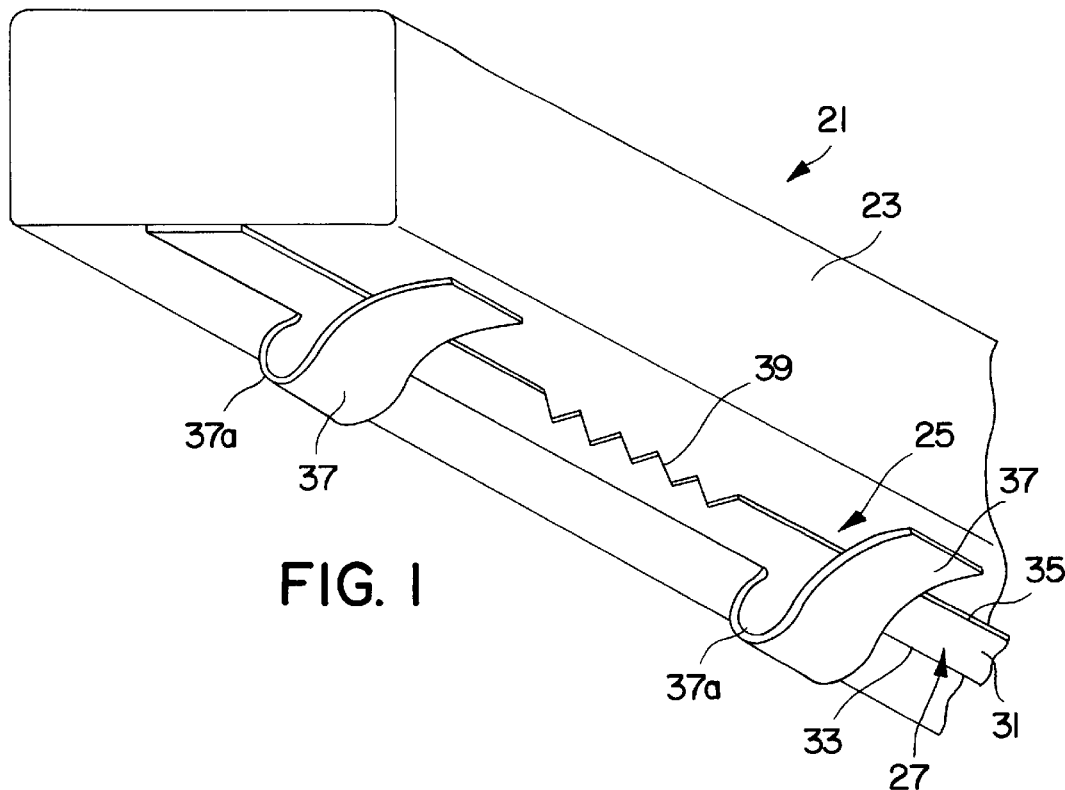
FIG. 1 is a perspective view of a gasket arrangement according to an embodiment of the present invention.

A gasket arrangement 21 according to an embodiment of the present invention is shown in FIG. 1. The gasket arrangement 21 includes a gasket 23. The gasket 23 may be any suitable gasket material and shape, such as the materials and shapes disclosed in U.S. patent application Ser. No. 09/139,654, entitled "MOUNTING SYSTEM AND METHOD FOR MOUNTING TRACK HAVING BARBED RIVETS," by Anthony Michael Sosnowski, filed Aug. 25, 1998, (Attorney Docket No. 012925-090), which is hereby incorporated by reference, and the materials and shapes disclosed in U.S. patent application Ser. No. 08/819,983, filed Mar. 18, 1997, entitled "SELF-TERMINATING, KNITTED METALIZED YARN EMI/RFI SHIELDING GASKET," which is hereby incorporated by reference.

Figure 2:
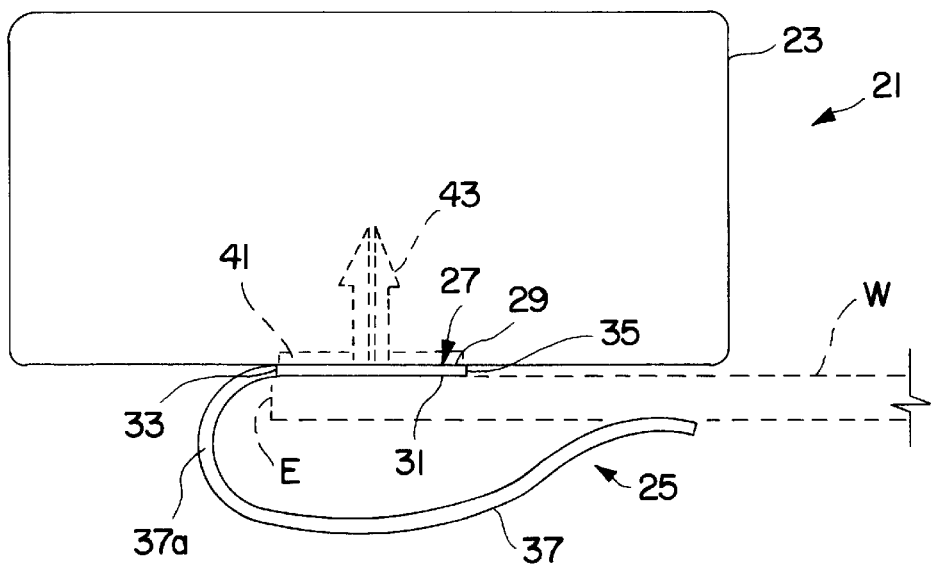
FIG. 2 is a side view of a gasket arrangement according to an embodiment of the present invention.

The gasket arrangement 21 further includes a retention clip track 25. As seen in FIG. 2, the retention clip track 25 preferably includes a substantially flat track 27 having a first surface 29, a second surface 31, a first edge 33 extending between the first surface and the second surface, and a second edge 35 extending between the first surface and the second surface on an opposite side of the track from the first edge. At least one clip 37 extends from the first edge 33. The clip 37 and the track 27 together form a substantially C-shaped structure. As seen in, for example, FIG. 3, the track 27 has a plurality of adjacent saw tooth-shaped recesses 39 extending from at least one of the second edge 35 toward the first edge 33 and the first edge toward the second edge, i.e, the saw teeth 39 can be on either edge of the track. The gasket 23 is attached to the track 27, typically to the first surface 29, although the gasket could be attached to the second surface if desired or necessary.

Figure 4:
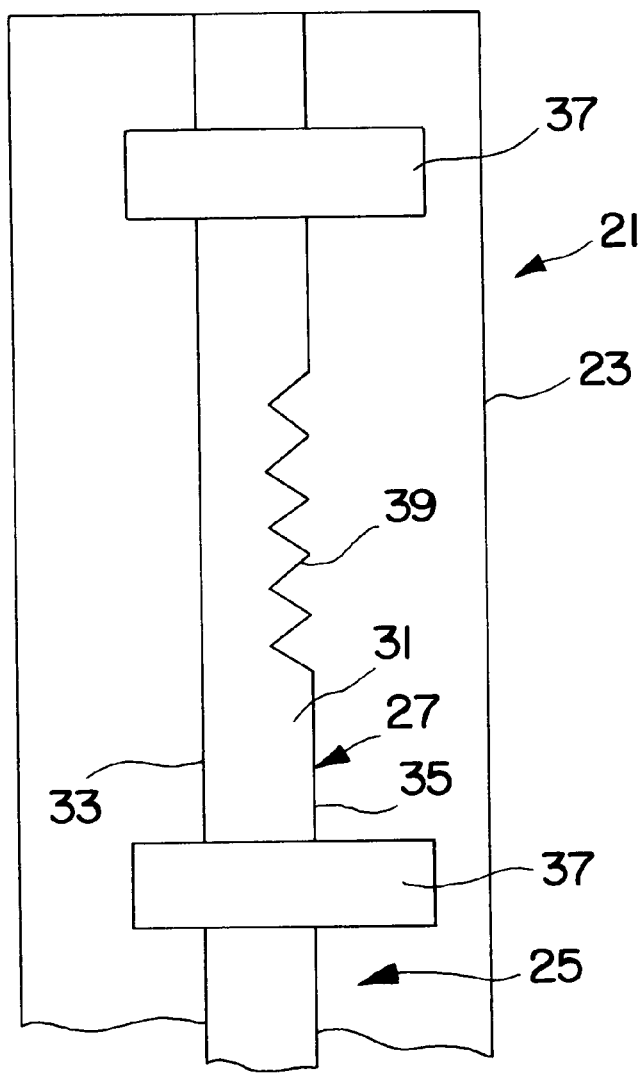
FIG. 4 is a bottom plan view of a gasket arrangement according to an embodiment of the present invention.
Figure 5:
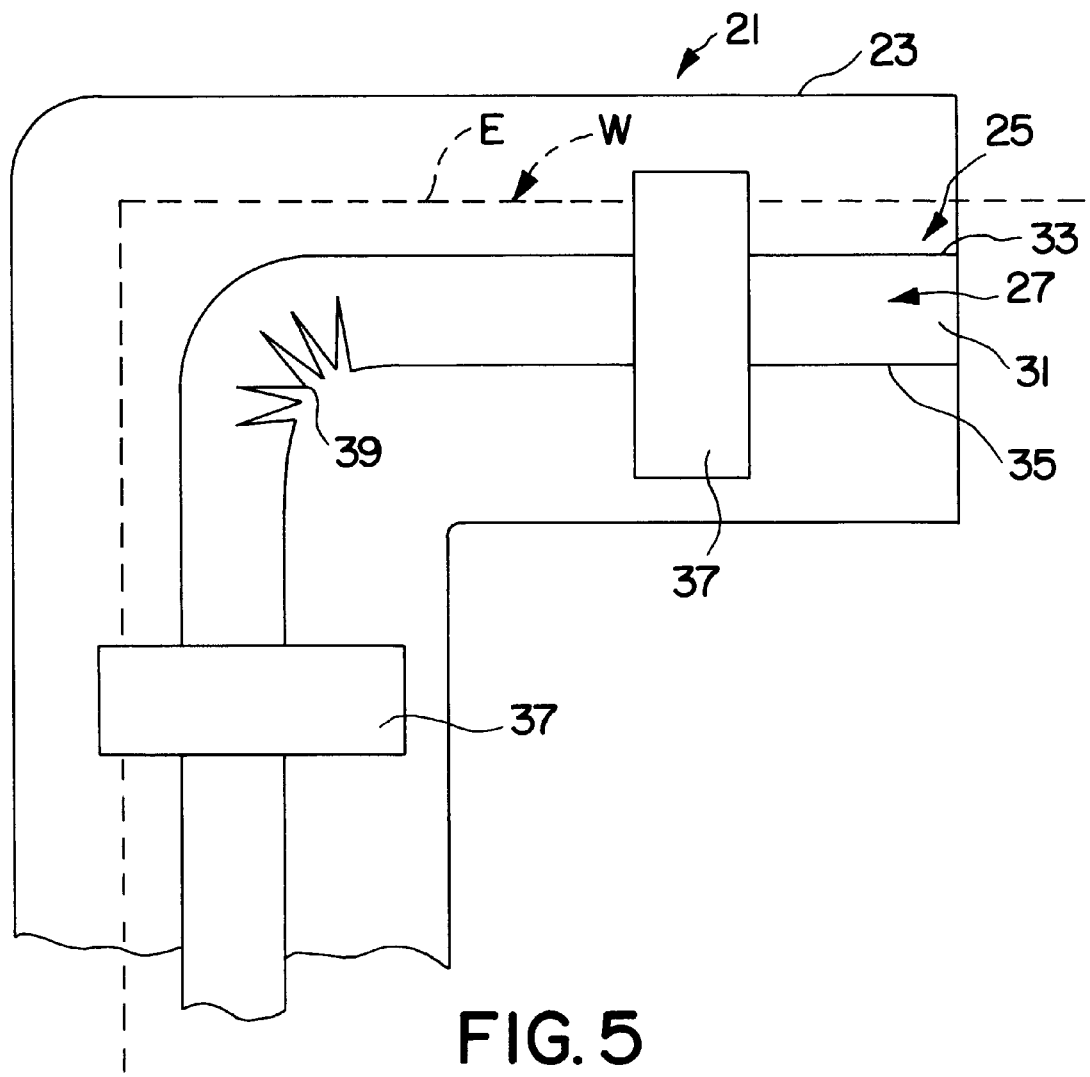
FIG. 5 is a bottom plan view of a bent gasket arrangement according to an embodiment of the present invention.

The saw teeth 39 facilitate bending of the gasket arrangement 21 in a plane of the track 27. When the gasket arrangement 21 is bent from a straight configuration at the saw teeth, as seen in FIG. 4, to a bent configuration at the saw teeth, as seen in FIG. 5, the spaces between the saw teeth close up. In this way, crumpling of the track 27 at corners can be reduced while using a single gasket arrangement to extend around corners of a wall W (shown in phantom in FIG. 5). The saw teeth 39 preferably extend as far into the track 27 as possible without unduly compromising the structural integrity of the track for its intended application, and the depth of the saw teeth can be determined on an application-by-application basis. Saw teeth 39 are preferably provided wherever it is intended to bend the gasket arrangement 21. While the drawings show series of limited numbers of saw teeth 39, if desired or necessary, however, saw teeth 39 can be provided along the entire length of one or both of the first and second edges 33 and 35.

Figure 3:
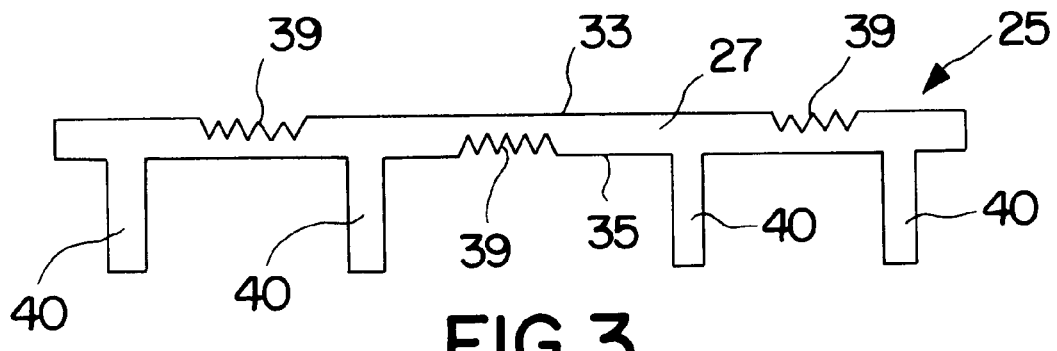
FIG. 3 is a top plan view of a retention clip track according to an embodiment of the present invention, prior to forming tabs of the track into clips.

The track 27 is preferably metallic, more preferably stainless steel. The clip 37 may, if desired or necessary, be formed of some other suitable material, such as plastic. The clip 37 is preferably formed from a tab 40 and is preferably formed integrally with the track 27, such as by being cut from a common sheet of material, as seen in FIG. 3. The clip 37 may, of course, be attached to the track 27, if desired or necessary. The clip 37 is bent relative to the track 27 to form the desired "C" shape for securing the gasket arrangement around the edges of walls.

Depending upon factors such as the thickness of the wall to which the gasket arrangement 21 is to be secured or the desired location of the gasket relative 23 to the edge of the wall W (shown in phantom in FIG. 2), the size shape of the clip 37 may be varied. For example, if the wall is quite thin, it may be desirable to have little or no opening in the "C" shape so that the clip 37 will firmly secure the gasket arrangement 23 to the wall; if the wall is comparatively thick, it may be desirable to have a wide opening in the "C" shape so that less force is required to secure the gasket arrangement to the wall. If it is desired to position the gasket closer to or further from the edge of the wall, the shape of the "C" shaped clip 37 may be varied by making the rear part 37a of the "C" shape longer or shorter, respectively.

The gasket 23 may be secured to the retention clip track 25 by any one of a variety of means, or in a combination of such means. A preferred securement means includes use of an adhesive or an adhesive tape 41 (shown in phantom in FIG. 2) between the gasket 23 and a surface, preferably the first surface 29, of the track 27. It is also possible to secure the gasket 23 to the retention clip track 25 by fasteners such as barbs 43 (shown in phantom in FIG. 2), prongs, rivets, and the like. Such fasteners may be integrally formed with the retention clip track 25, such as by forming barbs as in U.S. patent application Ser. No. 09/139,654, entitled "MOUNTING SYSTEM AND METHOD FOR MOUNTING TRACK HAVING BARBED RIVETS," by Anthony Michael Sosnowski, filed Aug. 25, 1998, which is hereby incorporated by reference, or may be separate components. Other possible securement techniques include: forming the gasket 23 so that the retention clip track 25 is partially embedded in the gasket, such as by molding the gasket around the track 27; capturing the track 27 in a slit in the gasket 23 so that the clip 37 extends out of the slit; and adhering the gasket 23 to the track 27 by partially melting the gasket so that it bonds to the track.

Figure 6:
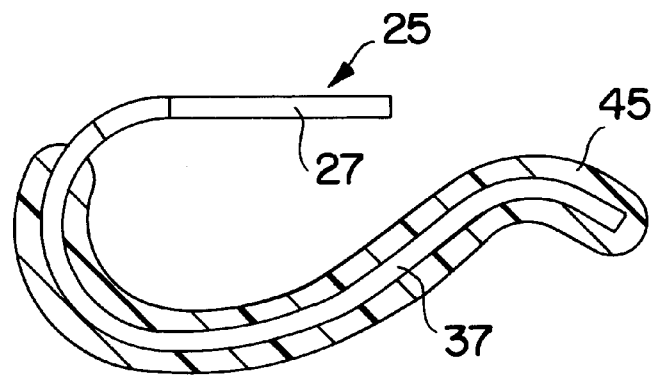
FIG. 6 is a partially cross-sectional side view of a retention clip track according to an embodiment of the present invention.

As seen in FIG. 6, an insulating material 45 is preferably provided on the clips 37. The insulating material 45 may be a material such as plastisol or powder paint. An advantage of providing the insulating material 45 is that the person installing the gasket arrangement 21 is afforded some additional protection against shock. Moreover, certain types of insulating material 45, such as plastisol, may assist in providing a positive securement between the gasket arrangement 21 and the wall to which it is to be secured. If desired or necessary, an insulating material may be provided on further parts of or the entire retention clip track 25, as opposed to just the clips 37.

The gasket arrangement 21 according to the present invention can be designed for specific applications, as desired or necessary. A preferred technique for making and thereafter securing the gasket arrangement 21 to a wall W (shown in phantom in FIG. 5), the wall preferably having a first surface, a second surface, and an edge E (shown in phantom in FIG. 5) between the first and the second surface, and the edge having at least one non-linear portion will now be described. The track 27 is provided with a plurality of tabs 40 that extend laterally from the first edge 33 of the track. The tabs 40 are preferably provided by being cut, together with the track 27, from a common sheet of material but may, if desired or necessary, be separately formed and attached to the track.

A plurality of saw tooth-shaped recesses 39 are formed in the track 27 such that the recesses extend from at least one of second edge 35 of the track toward the first edge 33 and a first edge of the track toward the second edge of the track. The plurality of tabs 40 are bent relative to track 27 so that the tabs and the track together form substantially C-shaped clips, as seen in, for example, FIGS. 1 and 2. The gasket 23 is attached to a surface, preferably the first surface 29, of the track 27 to form the gasket arrangement 21.

According to a particularly preferred technique for forming the gasket arrangement 21, prior to forming tabs 40 and/or saw teeth 39, the dimensions of the edge E of the wall W are input into a computer. The computer then determines where in the track 27 the saw tooth-shaped recesses 39 should be located to permit bending of the gasket arrangement 21 to conform to the shape of the edge E of the wall W. The saw tooth-shaped recesses 39 are then formed in the track 27 based on the locations determined by the computer. Similarly, in addition to or instead of determining the location of the saw teeth 39, the wall dimension information that is input into the computer can be used by the computer to determine locations along the track 27 at which the plurality of tabs 40 (FIG. 3) are to be provided in order to provide a sufficient number of clips 37, in optimal locations, to secure the gasket arrangement 21 to the wall W with a desired level of strength. The saw teeth 39 and the tabs 40 can be formed manually based upon instructional information provided by a computer, or automatically by a machine adapted to form the saw teeth and tabs in response to instructions from the computer. It will also be appreciated that, instead of using a computer to determine locations of saw teeth 39 and tabs 40, it is also possible for a person, such as an installer, to form the retention clip track with appropriately located saw teeth and tabs by hand or by machine, and simply sighting where it will be necessary to provide a bend or a clip 37 on the gasket arrangement 21. Specially adapted manual or automatic tools for use by installers on job sites may be provided to assist in forming retention clip tracks 25 having desired features.

In installing the gasket arrangement 21, as seen in FIG. 5, the gasket arrangement is bent at the saw teeth-shaped recesses 39 of the track 27 so that the gasket arrangement conforms generally to the shape of the edge E of the wall. The gasket arrangement 21 is secured to the wall W by fitting the wall in the clips 37 formed by the tabs 40 and the track 27, as seen in FIG. 2.

While this invention has been illustrated and described in accordance with a preferred embodiment, it is recognized that variations and changes may be made therein without departing from the invention as set forth in the claims.

What is claimed is:

1. A retention clip track, comprising:
   a substantially flat track having a first surface, a second surface, a first edge extending between the first surface and the second surface, and a second edge extending between the first surface and the second surface on an opposite side of the track from the first edge;
   at least one clip extending from the first edge, the clip and the track together forming a substantially C-shaped structure; and
   the track having a plurality of adjacent saw tooth-shaped recesses extending from at least one of the second edge toward the first edge and the first edge toward the second edge.

2. The retention clip track according to claim 1, wherein the clip is integrally formed with the track.

3. The retention clip track according to claim 1, further comprising barbs extending from the first surface.

4. The retention clip track according to claim 1, further comprising adhesive material disposed on the first surface.

5. The retention clip track according to claim 4, wherein the adhesive material includes a tape.

6. The retention clip track according to claim 1, further comprising means for securing a gasket to the first surface.

7. The retention clip track according to claim 1, wherein the track is metallic.

8. The retention clip track according to claim 1, wherein the track is stainless steel.

9. The retention clip track according to claim 1, wherein the track is plastic.

10. The retention clip track according to claim 1, further comprising an insulating material disposed on the at least one clip.

11. A gasket arrangement, comprising:
    a gasket; and a retention clip track, comprising,
   a substantially flat track having a first surface, a second surface, a first edge extending between the first surface and the second surface, and a second edge extending between the first surface and the second surface on an opposite side of the track from the first edge,
   at least one clip extending from the first edge, the clip and the track together forming a substantially C-shaped structure, and
   the track having a plurality of adjacent saw tooth-shaped recesses extending from at least one of the second edge toward the first edge and the first edge toward the second edge,
   wherein the gasket is attached to the track.

12. The gasket arrangement according to claim 11, wherein the clip is formed integrally with the track.

13. The gasket arrangement according to claim 11, further comprising barbs extending from the first surface for securing the gasket to the track.

14. The gasket arrangement according to claim 11, further comprising adhesive material disposed on the first surface for securing the gasket to the track.

15. The gasket arrangement according to claim 14, wherein the adhesive material includes a tape.

16. The gasket arrangement according to claim 11, wherein the track is metallic.

17. The gasket arrangement according to claim 11, wherein the track is stainless steel.

18. The gasket arrangement according to claim 11, wherein the track is plastic.

19. The gasket arrangement according to claim 11, further comprising an insulating material disposed on the at least one clip.

20. A method for securing a gasket arrangement to a wall, the wall having a first surface, a second surface, and an edge between the first and the second surface, and the edge having at least one non-linear portion, comprising the steps of:
   providing a longitudinal track with a plurality of tabs that extend laterally from a first edge of the track;
   forming a plurality of saw tooth-shaped recesses in the track such that the recesses extend from at least one of second edge of the track toward the first edge and a first edge of the track toward the second edge of the track;
   bending the plurality of tabs relative to track so that the tabs and the track together form substantially C-shaped clips;
   attaching a gasket to a surface of the track to form a gasket arrangement;
   bending the gasket arrangement at the saw teeth-shaped recesses of the track so that the gasket arrangement conforms generally to a shape of the edge of the wall;
   securing the gasket arrangement to the wall by fitting the wall in the clips formed by the tabs and the track.

21. The method according to claim 20, comprising the further steps of:
   inputting dimensions of the edge of the wall into a computer; and
   determining, with the computer, locations of the saw tooth-shaped recesses to permit bending of the gasket arrangement to conform to the shape of the edge of the wall, the saw tooth-shaped recesses being formed in the track based on the locations determined by the computer.

22. The method according to claim 21, comprising the further step of determining, with the computer, locations along the track at which the plurality of tabs are to be provided in order to provide a sufficient number of clips in optimal locations to secure the gasket arrangement to the wall with a desired level of strength.

23. The method according to claim 20, comprising the further steps of:
   inputting dimensions of the edge of the wall into a computer; and
   determining, with the computer, locations along the track at which the plurality of tabs are to be provided in order to provide a sufficient number of clips in optimal locations to secure the gasket arrangement to the wall with a desired level of strength.

24. A method for making a gasket arrangement for attachment to a wall, the wall having a first surface, a second surface, and an edge between the first and the second surface, and the edge having at least one non-linear portion, comprising the steps of:
   providing a longitudinal track with a plurality of tabs that extend laterally from a first edge of the track;
   forming a plurality of saw tooth-shaped recesses in the track such that the recesses extend from at least one of second edge of the track toward the first edge and a first edge of the track toward the second edge of the track;
   bending the plurality of tabs relative to track so that the tabs and the track together form substantially C-shaped clips;
   attaching a gasket to a surface of the track to form a gasket arrangement.

25. The method according to claim 24, comprising the further steps of:
   inputting dimensions of the edge of the wall into a computer; and
   determining, with the computer, locations of the saw tooth-shaped recesses to permit bending of the gasket arrangement at the saw tooth-shaped recesses to conform to the shape of the edge of the wall, the saw tooth-shaped recesses being formed in the track based on the locations determined by the computer.

26. The method according to claim 25, comprising the further step of determining, with the computer, locations along the track at which the plurality of tabs are to be provided in order to provide a sufficient number of clips in optimal locations to secure the gasket arrangement to the wall with a desired level of strength.

27. The method according to claim 24, comprising the further steps of:
   inputting dimensions of the edge of the wall into a computer; and
   determining, with the computer, locations along the track at which the plurality of tabs are to be provided in order to provide a sufficient number of clips in optimal locations to secure the gasket arrangement to the wall with a desired level of strength.

* * * * *